(12) United States Patent
Budach et al.

(10) Patent No.: US 9,910,065 B2
(45) Date of Patent: Mar. 6, 2018

(54) APPARATUS AND METHOD FOR EXAMINING A SURFACE OF A MASK

(71) Applicant: Carl Zeiss SMT GmbH, Oberkochen (DE)

(72) Inventors: Michael Budach, Hanau (DE); Thorsten Hofmann, Rodgau (DE); Klaus Edinger, Lorsch (DE); Pawel Szych, Munich (DE); Gabriel Baralia, Dieburg (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 15/158,779

(22) Filed: May 19, 2016

(65) Prior Publication Data

US 2016/0341763 A1    Nov. 24, 2016

(30) Foreign Application Priority Data

May 20, 2015   (DE) .................. 10 2015 209 219

(51) Int. Cl.
| | |
|---|---|
| *G01Q 30/02* | (2010.01) |
| *G01Q 30/06* | (2010.01) |
| *G01B 11/14* | (2006.01) |
| *G03F 1/84* | (2012.01) |

(52) U.S. Cl.
CPC ............ *G01Q 30/02* (2013.01); *G01B 11/14* (2013.01); *G01Q 30/06* (2013.01); *G03F 1/84* (2013.01)

(58) Field of Classification Search
CPC ........ G01Q 30/02; G01Q 30/06; G01B 11/14; G03F 1/84

USPC ............................................ 850/8, 9, 19, 20
See application file for complete search history.

(56) References Cited

U.S. PATENT DOCUMENTS

| 5,715,054 A | 2/1998 | Saurenbach et al. |
| 7,381,975 B1 | 6/2008 | Young et al. |
| 2006/0033024 A1 | 2/2006 | Sparks et al. |

FOREIGN PATENT DOCUMENTS

DE   43 44 499   7/1995 .............. H01J 37/28

OTHER PUBLICATIONS

German Office Action for German Application No. 10 2015 209 219.4 dated Feb. 26, 2016 (5 pages).
M. Bienias et al., "A metrological scanning force microscope used for coating thickness and other topographical measurements", *Applied Physics A*, vol. 66, pp. S837-S842 (1998).
K. Hasche et al., "Calibrated scanning force microscope with capabilities in the subnanometre range", *Surface and Interface Analysis*, vol. 33, pp. 71-74 (2002).
(Continued)

*Primary Examiner* — Nicole Ippolito
*Assistant Examiner* — Hanway Chang
(74) *Attorney, Agent, or Firm* — Fish & Richardson P.C.

(57) ABSTRACT

The present invention relates to apparatuses and methods for examining a surface of a test object, such as e.g. a lithography mask. In accordance with one aspect of the invention, an apparatus for examining a surface of a mask comprises a probe which interacts with the surface of the mask, and a measuring apparatus for establishing a reference distance of the mask from a reference point, wherein the measuring apparatus measures the reference distance of the mask in a measurement region of the mask which is not arranged on the surface of the mask.

39 Claims, 5 Drawing Sheets

(56) References Cited

OTHER PUBLICATIONS

G. Schitter et al., "Eliminating mechanical perturbations in scanning probe microscopy", *Nanotechnology*, vol. 13, pp. 663-665 (2002).
A. W. Sparks et al., "Atomic force microscopy with inherent disturbance suppression for nanostructure imaging", *Nanotechnology*, vol. 17, pp. 1574-1579 (2006).

APPARATUS AND METHOD FOR EXAMINING A SURFACE OF A MASK

CROSS-REFERENCE TO RELATED APPLICATION

This application claims priority to German patent application 10 2015 209 219.4, filed on May 20, 2015, the entire contents of which are hereby incorporated by reference.

TECHNICAL FIELD

The present invention relates to apparatuses and methods for examining a surface of a test object, such as e.g. a lithography mask.

BACKGROUND

Modern microscopic methods, such as e.g. atomic force microscopy or scanning tunneling microscopy, permit the examination of surfaces of test objects with an accuracy in the nanometer range.

However, a problem arising in the case of surface examinations at those scales consists of the apparatuses used to this end possibly being exposed to external disturbances which can influence and disturb the microscopy probes used for the examination to such a great extent that the desired measurement accuracy can no longer be achieved.

In order to remedy this problem, e.g. US 2006/0033024 A1 and the article A. W. Sparks and S. R. Manalis, "*Atomic force microscopy with inherent disturbance suppression for nanostructure imaging*", Nanotechnology 17 (2006), p. 1574-1579, 21 Feb. 2006, doi:10.1088/0957-4484/17/6/007 describe a scanning probe microscope which has the capability of inherently suppressing disturbances. An apparatus for measuring a property of a surface of a test object with the aid of scanning probe microscopy comprises a localized probe, which detects the property of the surface, and a delocalized sensor, which is mechanically coupled to the localized probe and arranged next to the latter. This setup renders it possible for the susceptibility of the scanning probe microscope to disturbances to be reduced.

The article G. Schitter and A. Stemmer, "*Eliminating mechanical perturbations in scanning probe microscopy*", Nanotechnology 13 (2002), p. 663 ff., 20 Sep. 2002, doi: 10.1088/0957-4484/13/5/324 discloses a method for removing mechanical vibrations in scanning probe microscopes by detecting the vibrations with a distance sensor and removing the vibrations from the measured topology signal retrospectively.

However, a disadvantage of the methods and apparatuses known from the prior art is that the delocalized (distance) sensor is always arranged next to the probe which is used for the actual measurement of the topography of the test surface. Therefore, the sensor and the probe measure different regions or points on the test surface, which may lead to inaccuracies when removing the mechanical disturbances by calculation or when suppressing the latter. However, the sensor cannot be moved arbitrarily close to the probe for structural reasons.

Moreover, it may be the case that, for example, the measurement region of the sensor is displaced beyond the edge of the test surface while the probe still measures the test surface, or vice versa. This means that the methods and apparatuses known from the prior art do not render it possible to measure the entire test surface of a test object and that an edge strip of the surface which cannot be detected simultaneously by the sensor and the probe always remains. Thus, there cannot be any direct compensation of the mechanical disturbances in this edge strip region.

SUMMARY

The present invention provides improved methods and apparatuses for examining surface properties of a test object, such as e.g. a lithography mask, which permit greater measurement accuracy and moreover enable the compensation of external mechanical disturbances over regions of the test surface that are as large as possible. In a general aspect, an apparatus for examining a surface of a mask is provided. In one embodiment, the apparatus comprises a probe which interacts with the surface of the mask, and a measuring apparatus for establishing a reference distance of the mask from a reference point, wherein the measuring apparatus measures the reference distance of the mask in a measurement region of the mask which is not arranged on the surface of the mask.

Hence, the measurement region does not lie on the surface of the mask examined by the probe in this exemplary embodiment. Rather, the measurement region lies on a different surface of the mask, for example on a surface of the mask lying opposite to the examined surface.

Here, the interaction between the probe and the surface can be characterized by e.g. a force or a tunneling current. By way of example, the interaction of the probe with the surface can be based on van der Waals forces between the probe and the surface, or it can comprise such forces. A person skilled in the art is aware of further interaction possibilities.

As a result of combining the measurement signal from the probe and the measured reference distance of the mask from the reference point, it is possible, in this case, to separate the features of the surface, which actually are of interest during the examination of the surface, from effects which are caused by external disturbances acting on the apparatus. An exemplary procedure to bring this about is described in the article "*Atomic force microscopy with inherent disturbance suppression for nanostructure imaging*" by A. W. Sparks and S. R. Manalis, which was already mentioned above.

Since the measuring apparatus measures the reference distance of the mask in a measurement region of the mask not arranged on the surface of the mask which carries the structures and properties to be examined and which is measured by the probe, the measuring apparatus can be positioned in such a way that the compensation of external disturbances is optimized, without the arrangement of the measuring apparatus impeding the desired arrangement of the probe, or vice versa.

By way of example, the measurement region can be arranged on a side of the mask facing away from the surface.

By way of example, the probe can be used for examining a surface of the mask lying on top, while the measurement region of the measuring apparatus is arranged on a surface of the mask lying underneath, or vice versa. A particularly large design freedom in respect of the arrangement of the probe and the measuring apparatus emerges in the case where the probe and the measuring apparatus measure on opposite surfaces of the mask.

By way of example, if the mask lies on an optionally displaceable placement table (see below) during the examination, the placement table can permit a measurement "from below" by virtue of, for example, consisting of a transparent material (optionally with a known refractive index) and therefore allowing an optical distance measurement there-through. Or the placement table is embodied as a type of frame which has cutouts in the regions of the mask to be examined, through which cutouts the distance can be measured. Further options are evident to a person skilled in the art from his technical knowledge.

In particular, the measurement region and a measurement point of the probe can lie substantially opposite one another on different sides of the mask.

Here, "substantially" can mean to the extent that this can be adjusted exactly from a constructional point of view and taking into account the extent of the measurement region. Under the assumption that the external disturbances do not lead to variations in the thickness of the mask to be examined, which was found to be an excellent approximation in practice, the arrangement of the measurement region of the measuring apparatus directly opposite the measurement point of the probe can enable a particularly good compensation of external disturbances since propagation effects of the disturbances within the apparatus or the mask can largely be neglected. Moreover, such an arrangement can permit (almost) the whole surface of the mask to be examined, since the case that, for example, the measuring apparatus has already been driven beyond the edge of the surface of the mask while the probe still measures over the mask does not occur.

The reference distance of the mask from the reference point can be a distance averaged over the measurement region. By way of example, the measurement region of the measuring apparatus can have an extent that is significantly larger than the structures of the surface which are examined by the probe. Here, and in the following text, a direction from the surface of the mask to the probe is denoted as the z-direction. Here, the xy-plane, which is perpendicular to the z-direction, can form a tangential plane to the mask at the measurement point of the probe. For a plane mask, the xy-plane can also substantially coincide with the surface of the mask to be examined, at least at "macroscopic scales", i.e. at scales which are significantly larger than the structures of the surfaces which are examined by the probe (e.g. on scales in the μm-range or mm-range).

As a result of the reference distance being an averaged distance, the measurement of the reference distance is particularly sensitive in relation to disturbances in the z-direction, which can have a particularly large negative influence on the measurement result of the surface examinations.

The measuring apparatus can operate according to the principle of optical interference and/or according to the principle of a capacitive distance measurement. Such an arrangement can be advantageous from a constructional and costs point of view. Moreover, such measuring apparatuses can readily be adjusted and calibrated, and they allow measurements in the desired accuracy range. The measuring apparatus can also operate according to a different measurement principle known to a person skilled in the art.

The reference point can be a point of the measuring apparatus. Thus, for example, the reference distance can be a distance between the measuring apparatus and the mask. By way of example, if an optical interferometer is used as a measuring apparatus, the reference point can be e.g. a point on the exit lens element of the interferometer or a point on the sensor of the interferometer or any other point of the interferometer.

The measuring apparatus can be mechanically coupled to the probe in such a way that a movement of the probe relative to the mask leads to a movement of the measuring apparatus relative to the mask.

Such mechanical coupling of the probe with the measuring apparatus can further improve the accuracy of the compensation of external disturbances. Here, the coupling can be rigid, or rigid to the greatest possible extent, such that the movements of the probe and the measuring apparatus are strongly correlated. By way of example, what very rigid coupling can achieve is that the probe and the measuring apparatus react with substantially the same movements to external disturbances. However, depending on the degree of the coupling here, longer or shorter time delays may occur between the movement of the probe and the movement of the measuring apparatus and/or the amplitudes of the movements may differ from one another. This may be desirable, for example in order to obtain more information about the nature of the disturbances herefrom, or this may be undesirable in order to keep the evaluation as simple as possible. Therefore, a person skilled in the art will configure the coupling to fit, depending on the requirements.

By way of example, the measuring apparatus and the probe can be configured as a constructional unit.

In accordance with a further aspect of the invention, an apparatus for examining a surface of a mask is provided, in which, in one embodiment, the apparatus has a probe which interacts with the surface of the mask, and also a first measuring apparatus for establishing a first reference distance of the mask from a first reference point and a second measuring apparatus for establishing a second reference distance of the mask from a second reference point.

What can be achieved by using a first measuring apparatus and a second measuring apparatus is that a larger region of the surface of the mask can be measured by the apparatus and that no, or a reduced amount of, extrapolation into the edge regions of the surface is required. By way of example, the first measuring apparatus and the second measuring apparatus can be arranged on different sides of the probe. It is also possible for the apparatus to have a third, a fourth, and optionally further measuring apparatuses.

The first reference point and the second reference point can also coincide. Thus, e.g. the first measuring apparatus and the second measuring apparatus can each measure a reference distance to the mask from a common reference point, wherein the two measuring apparatuses can be directed to different measurement regions on the mask.

It is possible that a first measurement region of the first measuring apparatus and a second measurement region of the second measuring apparatus do not completely overlap.

As already mentioned above, what can be achieved as a result of the measurement regions not completely overlapping and the two measuring apparatuses therefore being able to cover different regions of the surface of the mask is that at least one of the two measuring apparatuses still detects the surface of the mask in each (or at least in almost each) measurement position of the probe. Hence, a region of the surface of the mask which is as large as possible can be examined with direct disturbance compensation and an extrapolation, for example into the edge regions of the mask, can be avoided or reduced.

The first reference distance of the mask from the first reference point can be a distance averaged over a first measurement region of the first measuring apparatus and/or the second reference distance of the mask from the second reference point can be a distance averaged over a second measurement region of the second measuring apparatus. In respect of possible extents and forms of the measurement regions, reference is made to the corresponding explanations made above within the scope of the discussion of the measuring apparatus with one measurement region not arranged on the surface of the mask examined by the probe, which explanations are also applicable to the apparatus according to the invention described here.

The first measuring apparatus and/or the second measuring apparatus can operate according to the principle of optical interference and/or according to the principle of a capacitive distance measurement. The first measuring apparatus and/or the second measuring apparatus can also operate according to a different measurement principle known to a person skilled in the art.

The first reference point can be a point of the first measuring apparatus and/or the second reference point can be a point of the second measuring apparatus.

The probe can be mechanically coupled to the first measuring apparatus in such a way that a movement of the probe relative to the mask leads to a movement of the first measuring apparatus relative to the mask and/or the probe can be mechanically coupled to the second measuring apparatus in such a way that a movement of the probe relative to the mask leads to a movement of the second measuring apparatus relative to the mask.

Moreover, the first measuring apparatus and the second measuring apparatus can also be mechanically coupled to one another.

By way of example, the first measuring apparatus and the probe can be embodied as a constructional unit. Likewise, the second measuring apparatus and the probe can be embodied as a constructional unit. Finally, all three components can also be embodied as a constructional unit.

The advantages of these refinement possibilities were already discussed above within the scope of the discussion of the measuring apparatus with a measurement region not arranged on the surface of the mask examined by the probe, and the deliberations made there can be transferred to the first measuring apparatus and second measuring apparatus discussed here.

It is even possible for the first measuring apparatus and/or the second measuring apparatus to be embodied like the measuring apparatus described above, which measures a reference distance of the mask in a measurement region of the mask which is not arranged on the surface of the mask examined by the probe. Therefore, all features described further above with reference to such a measuring apparatus can also be used in the first and/or second measuring apparatus, and vice versa.

In accordance with a further aspect of the invention, an apparatus for examining a surface of a mask is provided, in which, in one embodiment, the apparatus has a probe which interacts with the surface of the mask, and also a measuring apparatus for establishing a reference distance of the mask from a reference point and a correlation unit, which is embodied to correlate a measurement signal from the probe and a measurement signal from the measuring apparatus with one another.

It was already explained above that the action of disturbances on an apparatus for examining a surface of a mask generally constitutes a physically complex process. Thus, external disturbances will generally act not only in the z-direction but also have components in the xy-direction. Moreover, such disturbances will only have a finite propagation speed, i.e. they will propagate through the apparatus and influence different regions of the apparatus at different times and with different strengths. Furthermore, the degree of coupling between the probe, the measuring apparatus and optionally the mask may have an influence on how the probe and the measuring apparatus react to the external disturbances and move relative to the mask. Where necessary, this must be taken into account during the evaluation.

In order to account for these various influencing factors, use can be made of a correlation unit which renders it possible also to consider e.g. the finite propagation speed, the influence of the coupling between probe and measuring apparatus or a damping of the disturbances when passing through the apparatus. Such a correlation unit can allow significantly more complex disturbances to be detected and modelled, for example disturbances resolved in time and space, comprising components in all three spatial directions, in order thereby to allow an improved compensation of the external disturbances.

Also, the improved modelling of the influence of the external disturbances can allow an improved extrapolation of the disturbance compensation into the edge regions of the mask when only a single measuring apparatus arranged next to the probe is used. As a result of this, it is possible to increase the measurement accuracy of the apparatus according to the invention.

The correlation unit can have a phase analyzer, which is configured to establish a phase difference between the measurement signal from the probe and the measurement signal from the measuring apparatus.

By way of example, the finite propagation speed of the disturbances can be accounted for by establishing a phase difference between the signal from the probe and the signal from the measuring apparatus. In turn, this can render it possible to arrange probe and measuring apparatus at a distance from one another in the apparatus and nevertheless achieve a good compensation of external disturbances—even in edge regions of the mask. This can simplify the constructional design of such an apparatus.

The measuring apparatus of the apparatus with a correlation unit can be embodied as a measuring apparatus described above, which measures a reference distance of the mask in a measurement region of the mask which is not arranged on the surface of the mask measured by the probe. Therefore, all features described with respect to such a measuring apparatus can also be transferred to the measuring apparatus of the apparatus with a correlation unit, and vice versa.

Moreover, the measuring apparatus of the apparatus with a correlation unit can be embodied as a first measuring apparatus and/or second measuring apparatus of an apparatus as described above. Then, it is also possible to use a plurality of correlation units in this case. Therefore, all features described with respect to such a first and/or second measuring apparatus can likewise be transferred to the measuring apparatus of the apparatus, described here, with a correlation unit, and vice versa.

In accordance with a further aspect of the invention, an apparatus for examining a surface of a mask is provided, in which, in one embodiment, the apparatus has a probe which interacts with the surface of the mask, and also a measuring apparatus for establishing a reference distance of the mask from a reference point. Here, the measuring apparatus measures the reference distance of the mask in a measurement region of the mask, wherein a measurement point of the probe lies within the measurement region.

In this embodiment, the measurement region on the surface of the mask used for establishing the reference distance thus comprises the measurement point of the probe such that a disturbance compensation is always made possible in this embodiment, at least for the "close vicinity" of the measurement point of the probe. In particular, this renders it possible to avoid the case where the measurement region of the measuring apparatus was already driven completely beyond the edge of the mask while the measurement point of the probe still lies over the mask surface.

In particular, it is possible that the measuring apparatus has a beam path and the probe is arranged in the beam path of the measuring apparatus.

By way of example, the probe can be a cantilever of an atomic force microscope. Now, if the beam path and the extent of the measurement region of the measuring apparatus are selected in such a way that the light reflected by the cantilever or the "shadowing" of the cantilever in the measurement region of the measuring apparatus is negligible in relation to the light reflected by the mask surface in the measurement region that is not shadowed, it is possible to obtain a sufficiently high measurement accuracy in respect of the reference distance despite arranging the cantilever within the beam path. Here, the mentioning of a cantilever of an atomic force microscope should merely be considered to be an example and a person skilled in the art will identify that the principle just explained above can also be transferred to other types of probes for examining surfaces.

By way of example, the beam path of the measuring apparatus can have a reflection element which images a collimated light beam onto the measurement region.

Imaging a collimated light beam onto the measurement region can increase the measurement accuracy of the measurement of the reference distance or simplify the measurement. It can also promote averaging of the measurement of the reference distance over the measurement region. By way of example, the use of a reflection element can serve to save installation space or simplify the design of the apparatus in a different way.

By way of example, the reflection element can be embodied as a plane mirror. The reflection element can also be embodied as a concave mirror, in particular as a parabolic mirror. Differently shaped mirrors are likewise conceivable.

Once again resorting to the example of a cantilever of an atomic force microscope for illustrative purposes, the use of a plane mirror, which may be significantly larger than the cantilever, can lead to e.g. the light reflected or blocked by the cantilever being of no consequence in relation to the light reaching the mask surface and being reflected by the latter. There can also be similar behavior when using a concave or parabolic mirror: Such a mirror can image or even focus the collimated light beam onto the measurement region on the mask surface in a tapering light cone. Here, the diameter of the light cone in the region of the cantilever can have similar dimensions to the case of the plane mirror, as a result of which the amount of light blocked or reflected by the cantilever may be negligible. Nevertheless, focusing onto a measurement region with a small diameter can be achieved, if desired, and a sufficient amount of light can be guided onto this measurement region. By way of example, the larger the aperture angle of the light cone, the less consequential the shadowing by the cantilever is.

Moreover, the measuring apparatus of the apparatus described here can be embodied as a first measuring apparatus and/or second measuring apparatus of an apparatus as described above. Therefore, all features described with respect to such a first and/or second measuring apparatus can likewise be transferred to the measuring apparatus of the apparatus, described here, and vice versa.

Furthermore, the measuring apparatus of the apparatus described here can also be embodied as a measuring apparatus of an apparatus with a correlation unit. Therefore, all features described with respect to such a measuring apparatus can likewise be transferred to the measuring apparatus of the apparatus, described here, and vice versa.

An apparatus according to the invention can furthermore have a disturbance source, which is configured to expose the apparatus to controllable disturbances.

By introducing controllable disturbances in contrast to random disturbances as may occur during normal operation of the apparatus, it is possible to closely examine the response of the apparatus to the controllable disturbances and therefore obtain a very accurate calibration of the apparatus.

An apparatus according to the invention can furthermore have a placement table for placing the mask and an actuator which is embodied to displace the placement table in at least one direction.

An actuator can be understood to be a complicated constructional arrangement which renders it possible to displace the placement table as desired. To this end, the actuator can have a plurality of individual components. By way of example, the actuator can have a plurality of piezo-regulators, which are able to displace the placement table in one or more spatial directions. By way of example, the actuator can be configured to displace the placement table relative to the probe in such a way that a strength of the interaction between the probe and the surface is kept substantially constant. The actuator can also be configured to displace the placement table in such a way that the surface to be examined is scanned by the probe.

By way of example, during the scanning over the surface, the actuator can displace the placement table in the z-direction in such a way that a force, e.g. a van der Waals force, remains constant between the tip of the probe and the examined surface of the mask, and so the apparatus is operated as an atomic force microscope (AFM). Or, during the scanning over the surface, the actuator displaces the placement table in the z-direction in such a way that a tunneling current remains constant between the tip of the probe and the examined surface of the mask, and so the apparatus is operated as a scanning tunneling microscope (STM). However, it is clear to a person skilled in the art that these are merely two examples. Further options for examining a mask surface known from the prior art can likewise find use and the present invention is not restricted to the examples specified here.

An apparatus according to the invention can also have a locator for determining a position of the placement table within a plane defined by the placement table. In principle, such a locator can also supply a position of the placement table within another predefined plane.

By way of example, one or more optical interferometers and/or capacitive distance measuring units can be used as locators in order to establish the position of the placement table within the xy-plane discussed above (or in a different predefined plane). This can contribute to a better detection of components of the external disturbances which act perpendicular to the z-direction as well and to an elimination of these from the measurement or the measurement results. Hence, such a locator can further increase the achievable measurement accuracy of the apparatus.

As an alternative or in addition to a displaceable placement table, an apparatus according to the invention can have a displacement unit which is embodied to displace the probe in at least one direction. By way of example, the displacement unit can be configured to displace the probe in such a way that a strength of the interaction between the probe and the surface of the mask is kept substantially constant, analogously to the corresponding explanations in this respect within the scope of the description of the displaceable placement table found further above. The displacement unit can also serve to displace the probe in the mask plane in order thereby to scan the surface to be examined.

In general, the same statements apply to the displacement unit as to the actuator for displacing the placement table. Thus, the displacement unit can have e.g. one or more piezo-regulators, which are able to displace the probe in one or more spatial directions.

An apparatus according to the invention can also have a probe locator for determining a position of the probe within a predefined plane. By way of example, the probe locator can supply a position of the probe within a plane defined by the placement table or within a plane defined by the surface of the mask. Here too, it is possible e.g. to use one or more optical interferometers and/or capacitive distance measuring units.

Thus, the displacement of the placement table and the displacement of the probe constitute two possible forms of operation of an apparatus according to the invention, which can each be used on their own, or else in combination with one another.

In the case where the probe is actively displaced, the apparatus according to the invention can furthermore be configured in such a way that the measuring apparatus or the first and/or second measuring apparatus follows the displacements of the probe; i.e., it is or they are displaced together with the probe. To this end, a rigid mechanical coupling, for example, may be present between the probe and the respective measuring apparatus (see above). By way of example, the probe and the respective measuring apparatus can be embodied as a constructional unit.

Moreover, an apparatus according to the invention can be embodied to be calibrated by a displacement of the placement table and/or a displacement of the probe along a predetermined sequence of movements.

In particular, a scale of all sensors, probes and measuring apparatuses present in the apparatus can be determined by displacing the placement table and/or the probe along a predetermined sequence of movements and the scales of these components can be normalized with respect to one another. If such a normalization is omitted, e.g. artefacts which appear like an external disturbance but are based on different measurement scales of the components could occur in the measurement results.

For calibration purposes, it is furthermore also possible to set the scanning variable of the apparatus according to the invention to zero, i.e. the tip of the probe remains stationary at a specific location, with all other operating parameters being selected as in the subsequent image recording. As a result of this, it is possible to obtain data which only (or at least predominantly) image the disturbances. Subsequently, one or more adaptation parameters can be optimized in such a way that the data corrected by these parameter adaptations are free from disturbances. By way of example, such a procedure could be carried out prior to each image recording in order to further improve the measurement accuracy.

The displacement of the placement table and/or of the probe along a predefined sequence of movements and the determination of such adaptation parameters can find use alternatively or in combination with one another.

An apparatus according to the invention can have a compensation unit for compensating external disturbances by applying a compensation signal to a signal for controlling the apparatus. The signal, to which the compensation signal is applied, can serve to control the actuator and/or to control the displacement unit.

Thus, the compensation unit can permit a type of "noise cancelling" such that the influence of the external disturbances does not need to be removed from the obtained measurement signals by calculation retrospectively, or at best only needs to be removed in part, but that the external disturbances are already suppressed directly during the measurement by countermeasures.

The examination of the surface can comprise an examination of a topography of the surface.

To this end, use can be made of e.g. the already mentioned principles of atomic force microscopy or scanning tunneling microscopy or of other principles and methods from the prior art suitable for this purpose.

Here, reference is furthermore made to the fact that the various functional components, apparatuses and units, which are discussed within the scope of the invention, need not necessarily also constitute separate constructional components. Rather, a plurality of, or even all, functional components, apparatuses and units can also be combined in an integral constructional component. Furthermore, it is also possible for individual, some or all functional components to be realized by software which, when executed, causes corresponding constructional components to provide the respective functionality.

A further aspect of the invention is formed by a method for examining a surface of a mask, wherein use is made of an embodiment of an apparatus according to the invention.

DESCRIPTION OF DRAWINGS

The following detailed description describes possible embodiments of the invention, with reference being made to the following figures.

DETAILED DESCRIPTION

Possible embodiments of the present invention are described in the following detailed description. However, emphasis is placed on the fact that the present invention is not restricted to these embodiments. Rather, within the scope of the invention, the design options described in relation to these specific embodiments can also be modified further and combined differently with one another and individual optional features can also be omitted, to the extent that these appear dispensable in each case. In order to avoid redundancies, reference is therefore made, in particular, to the explanations in the preceding paragraphs, which also retain their validity for the detailed description which now follows below.

Moreover, reference is made to the fact that, for reasons of simplicity, it is always the examination of surfaces of lithography masks that is described below, without the invention being restricted thereto. Rather, it is also possible to examine the surfaces of different types of test object within the scope of the invention.

Figure 1:
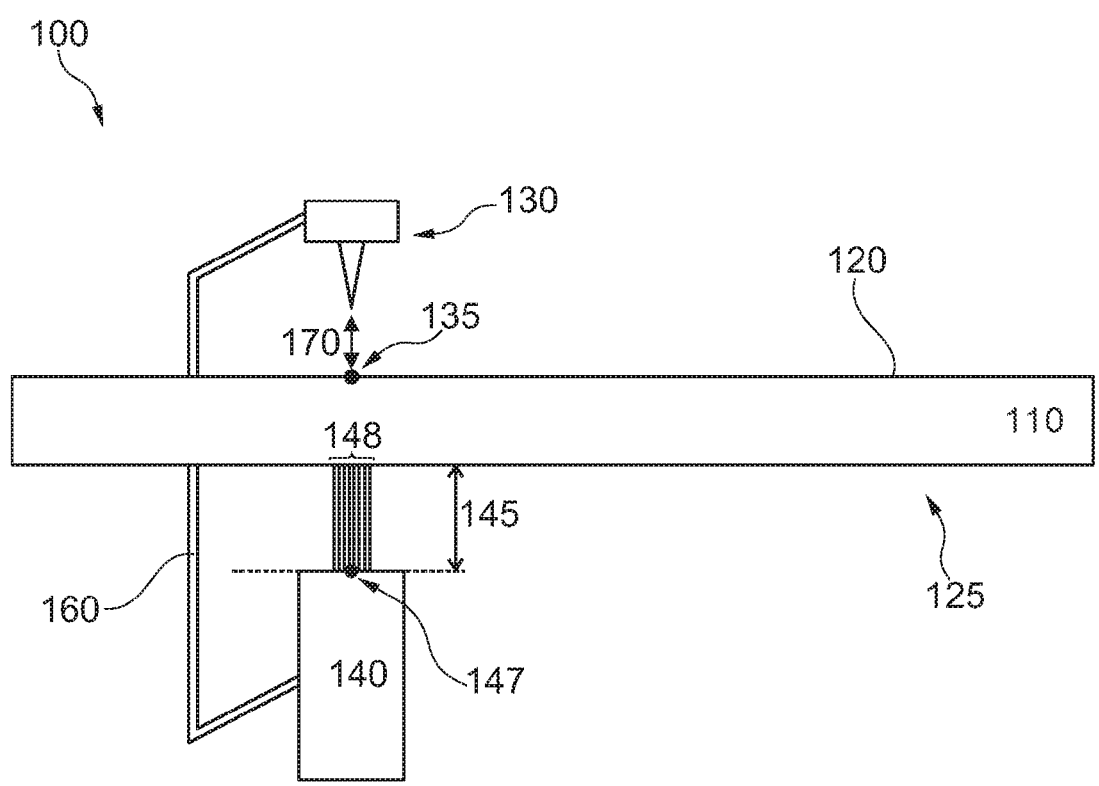
FIG. 1: shows an embodiment of an apparatus according to the invention for examining a surface of a test object with a measuring apparatus which does not measure on the same surface as the probe.

FIG. 1 shows an embodiment of an apparatus 100 for examining a surface 120 of a mask 110. In the case shown here, the mask 110 is a planar or plane mask 110. In addition to the surface 120, the properties of which are intended to be examined, the mask 110 therefore has a second surface on the opposite side 125.

The apparatus 100 has a probe 130 for the purposes of examining the surface 120. The probe 130 interacts with the surface 120 of the mask 110 at a measurement point 135. By way of example, the interaction of the probe 130 with the surface 120 of the mask 110, which is indicated by the double-headed arrow 170, can be characterized by a force or by a tunneling current between the tip of the probe 130 and the measurement point 135 on the surface 120 of the mask 110. By way of example, the interaction of the probe 130 with the surface 120 of the mask 110 can be based on van der Waals forces between the probe 130 and the surface 120, or it can comprise such forces. Further options are evident to a person skilled in the art. By way of example, for the purposes of examining the surface 120 of the mask 110, the mask 110 can be displaced or moved relative to the probe 130 in such a way that a strength of the interaction 170 between the probe 130 and the surface 120 is kept substantially constant (i.e. within the measurement errors).

To this end, the mask 110 can be placed e.g. onto a placement table (not shown here) and the placement table can be connected to an actuator (likewise not shown here) which is embodied to displace the placement table in one or more spatial directions. Alternatively or additionally, the probe 130 can also be actively displaced. To this end, the apparatus 100 can have a displacement unit (not shown) which is embodied to displace the probe 130 in one spatial direction or in a plurality of spatial directions.

Basic methods for examining a mask surface 120 using the interaction 170 between the tip of a probe 130 and the mask surface 120 are known to a person skilled in the art. Therefore, this point is not discussed in any more detail here.

The apparatus 100 furthermore has a measuring apparatus 140 which serves to establish a reference distance 145 of the mask 110 from a reference point 147. The measuring apparatus 140 measures the reference distance 145 of the mask 110 in a measurement region 148 of the mask 110 which is not arranged on that surface 120 of the mask 110 which is examined by the probe 130. Rather, in the case shown here, the measurement region 148 is arranged on the side 125 of the mask 110 which faces away from the surface 120 to be examined. The measurement point 135, which establishes an interaction 170 with the tip of the probe 130, and the measurement region 148 of the measuring apparatus 140 in this case lie substantially opposite one another on different sides of the mask 110. Here, "substantially" can mean to the extent that this can be adjusted exactly from a constructional point of view and taking into account the extent of the measurement region 148 (by way of example, a center point of the measurement region 148 can lie opposite the measurement point 135 or any point of the measurement region 148 can lie opposite the measurement point 135).

By way of example, the measuring apparatus 140 can operate according to the principle of optical interference and/or according to the principle of a capacitive distance measurement. Other measurement principles known to a person skilled in the art can likewise find use in the measuring apparatus 140. By way of example, the measuring apparatus 140 can be a laser interferometer.

The measuring apparatus 140 can be configured in such a way that the reference distance 145 of the mask 110 from the reference point 147 is averaged over the measurement region 148. By way of example, the measurement region 148 can have a round, oval or another form.

The reference point 147, from which the reference distance 145 of the mask 110 is measured, can be e.g. any point of the measuring apparatus 140 in this case. By way of example, if the measuring apparatus 140 is a laser interferometer, the reference point 147 can be e.g. a point on the exit lens element of the interferometer or a point on the sensor of the interferometer, etc.

The measuring apparatus 140 can be mechanically coupled to the probe 130 in such a way that a movement of the probe 130 relative to the mask 110 leads to a movement of the measuring apparatus 140 relative to the mask 110. In the illustration of FIG. 1, such a mechanical coupling 160 is indicated. By way of example, in the case where the probe 130 can be actively displaced by a displacement unit, this coupling can be embodied in such a way that probe 130 and measuring apparatus 140 are moved together like one unit by way of the displacement unit. By way of example, the probe 130 and the measuring apparatus 140 can be embodied as a constructional unit.

By analyzing the measurement signal of the probe 130 and the measured reference distance 145, the apparatus 100 can be used to distinguish between the influences of external disturbances on the apparatus 100 and structure information in respect of the surface 120 of the mask 110 and the disturbing influences of the external disturbances can therefore be at least partly compensated or removed from the measurement results by calculation.

Figure 2A:
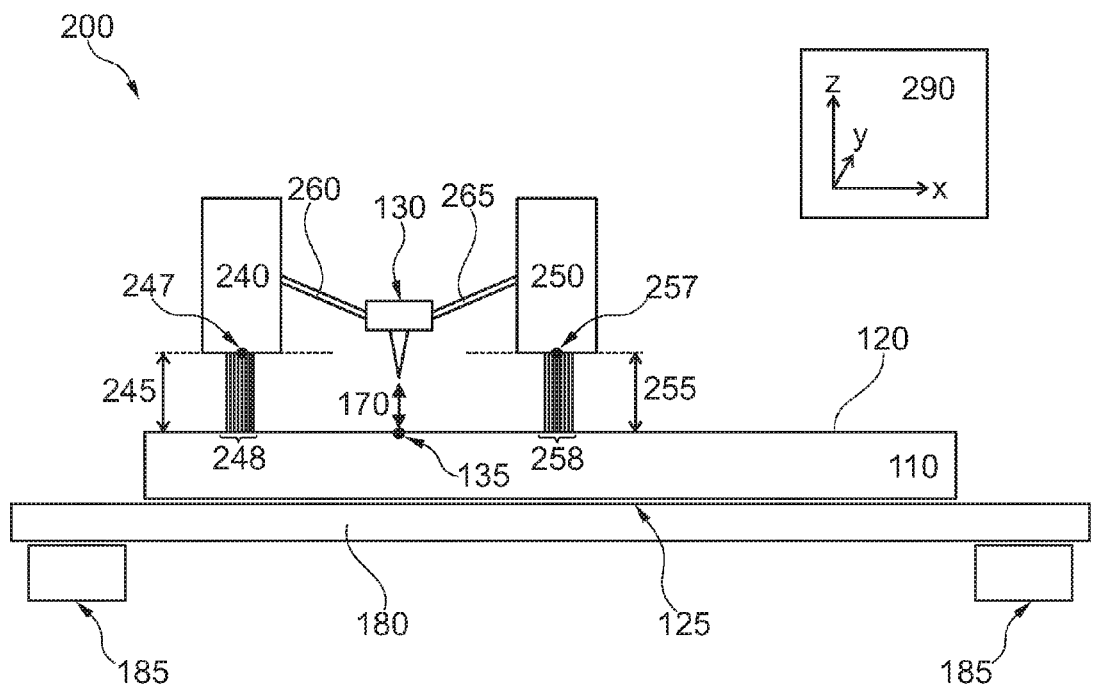
FIGS. 2a-b: show an embodiment of an apparatus according to the invention for examining a surface of a test object with a probe and two measuring apparatuses.

FIG. 2a shows an embodiment of a further apparatus 200 according to the invention for examining a surface 120 of a mask 110. The apparatus 200 has a probe 130 which interacts with the surface 120 of the mask 110. In respect of the mask 110, the surfaces/sides 120, 125 thereof, the probe 130 and the interaction 170 thereof with a measurement point 135 on the surface 120 of the mask 110, reference is made to the corresponding explanations in the discussion of FIG. 1, which can be transferred to the embodiment 200 shown here.

FIG. 2a explicitly shows a placement table 180, onto which the mask 110 has been placed. The placement table 180 is connected to an actuator 185 which allows the placement table 180 to be displaced in at least one spatial direction. By way of example, the actuator 185 can have one or more piezo-regulators and/or a spindle drive, etc. Alternatively or additionally, the probe 130 could also be actively displaced by a displacement unit, as already discussed above.

A coordinate system 290 is plotted top right in FIG. 2a. As may be gathered from the coordinate system 290, a direction from the measurement point 135 on the surface 120 of the mask 110 to the probe 130 is denoted the z-direction. This direction is perpendicular to a plane lying in the xy-direction, which in this case coincides with a plane defined by the placement table 180. However, in principle, it also would be conceivable for the z-direction to be at an angle from a plane defined by the placement table 180, i.e. for the plane of the table not to coincide with the xy-plane. These statements in respect of the x-, y- and z-direction can also be transferred to all other embodiments of the invention described herein, and this is why the coordinate system 290 is only plotted once, in FIG. 2a.

The actuator 185 can be configured to displace the placement table 180 in such a way that a strength of the interaction 170 between the probe 130 and the surface 120 is kept substantially constant in order thus, for example, to allow an examination of the topography or of other properties of the surface 120. If, alternatively or additionally, the probe 130 is actively displaced by a displacement unit, the displacement unit could also bring about the displacement of the probe 130 relative to the mask 120 required therefor, or the actuator 185 and displacement unit could interact to this end.

The apparatus 200 has a first measuring apparatus 240 for establishing a first reference distance 245 of the mask 110 from a first reference point 247 and a second measuring apparatus 250 for establishing a second reference distance 255 of the mask 110 from a second reference point 257. Even though not shown here, it is also possible for the apparatus 200 to have further measuring apparatuses for establishing further reference distances.

In the embodiment shown in FIG. 2a, the first measuring apparatus 240 and the second measuring apparatus 250 are arranged next to the probe 130 on different sides. Here, the measurement point 135 lies between the first measurement region 248 of the first measuring apparatus 240 and the second measurement region 258 of the second measuring apparatus 250. In the embodiment shown here, the first measurement region 248 and the second measurement region 258 do not have any overlap. However, in principle, it is also possible for the first measurement region 248 and the second measurement region 258 to partly overlap. However, as result of the first measurement region 248 and the second measurement region 258 not completely overlapping, it is possible to cover a larger region of the surface 120 of the mask 110 by using two measuring apparatuses 240 and 250 than would be possible in the case of using only one measuring apparatus.

In this case, the first reference distance 245 of the mask 110 from the first reference point 247 can be a distance averaged over the first measurement region 248. Likewise, the second reference distance 255 of the mask 110 from the second reference point 257 can be a distance averaged over the second measurement region 258. In order to enable such an averaged measurement, the first measuring apparatus 240 and/or the second measuring apparatus 250 can operate, for example, according to the principle of optical interference and/or the principle of a capacitive distance measurement; by way of example, this can be a laser interferometer. Other measurement principles known to a person skilled in the art can likewise find use here. In respect of possible forms and extents of the measurement regions 248 and 258, reference is made to the corresponding explanations in relation to the measurement region 148 above.

As shown here, the first reference point 247 can be a point of the first measuring apparatus 240. Analogously, the second reference point 257 can be a point of the second measuring apparatus 250.

FIG. 2a furthermore shows a first mechanical coupling 260 between the first measuring apparatus 240 and the probe 130 and a second mechanical coupling 265 between the second measuring apparatus 250 and the probe 130. While direct mechanical coupling between the first measuring apparatus 240 and the second measuring apparatus 250 is not shown, a person skilled in the art will understand that such a coupling may likewise be present.

The first mechanical coupling 260 can lead to a movement of the probe 130 relative to the mask 110 leading to a movement of the first measuring apparatus 240 relative to the mask 110. The second mechanical coupling 265 can lead to a movement of the probe 130 relative to the mask 110 leading to a movement of the second measuring apparatus 250 relative to the mask 110. As already shown further above, the design of the first mechanical coupling 260 or the second mechanical coupling 265 can have effects on the correlation of the measurement signals from the probe 130 and from the first or second measuring apparatus 240, 250. The use of such correlations for suppressing disturbances can increase the measurement accuracy achievable by way of the apparatus 200. The possibility of such a mechanical coupling that the respective measuring apparatus 240, 250 is displaced together with the probe 130 in the case of an active displacement of the latter was already discussed. By way of example, the first measuring apparatus 240 and/or the second measuring apparatus 250 can be configured as a constructional unit together with the probe 130.

Figure 2B:
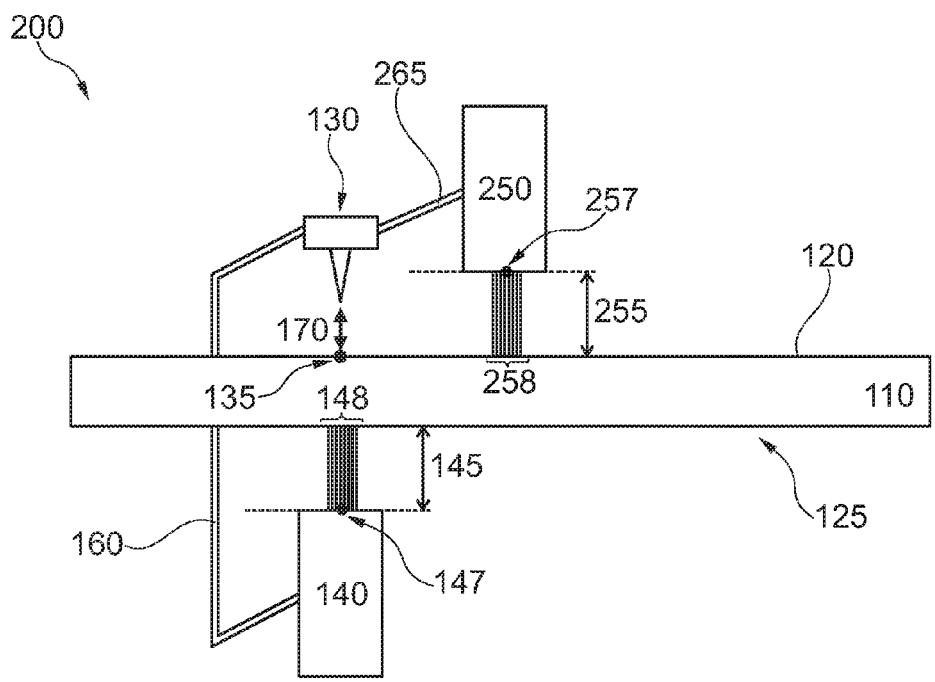

However, as shown in FIG. 2b, it is also possible for one of the two measuring apparatuses 240, 250—or also for both—to be configured as a measuring apparatus 140, the measurement region 148 of which is arranged on a side 125 of the mask 110 lying opposite the surface 120. In respect of possible design options of such a measuring apparatus 140, reference is made to the discussion in relation to FIG. 1 above and the statements made there can be transferred to the embodiment shown in FIG. 2b. In FIG. 2b, the first measuring apparatus 240 from FIG. 2a was replaced by such a measuring apparatus 140 "measuring from below". However, this is merely an example.

Figure 3A:
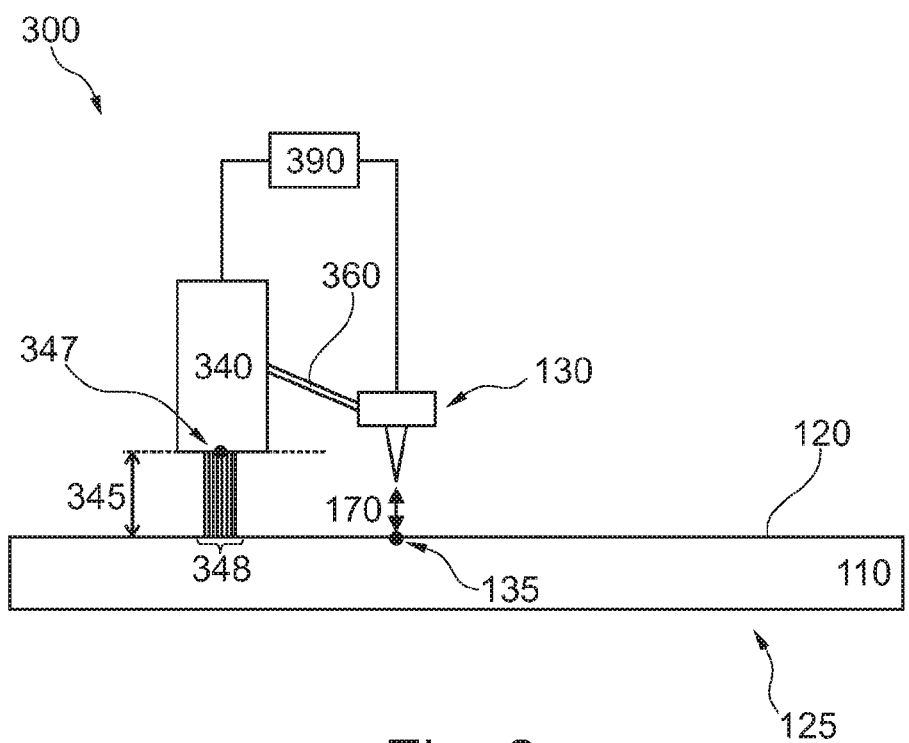
FIGS. 3a-c: show an embodiment of an apparatus according to the invention for examining a surface of a test object with a correlation unit.

FIG. 3a shows an embodiment of a further apparatus 300 according to the invention for examining a surface 120 of a mask 110. The apparatus 300 has a probe 130 which interacts with the surface 120 of the mask 110. In respect of the mask 110, the surfaces/sides 120, 125 thereof, the probe 130 and the interaction 170 thereof with a measurement point 135 on the surface 120 of the mask 110, reference is made once again to the corresponding explanations in the discussion of FIG. 1, which can be transferred directly to the embodiment 300 shown here.

The apparatus 300 furthermore has a measuring apparatus 340 for establishing a reference distance 345 of the mask 110 from a reference point 347. Here, the measuring apparatus 340 measures the reference distance in a measurement region 348.

In respect of possible embodiments of the measuring apparatus 340 and further details in respect of the reference distance 345, the measurement region 348 and the position of the reference point 347, reference is made to the corresponding explanations relating to the apparatuses 100 and 200 shown in FIGS. 1 and 2a-b, which can be transferred to the apparatus 300 shown here in an analogous manner.

As shown explicitly in FIG. 3a, the measuring apparatus 340 can have e.g. a mechanical coupling 360 with the probe 130, which leads to a movement of the probe 130 relative to the mask leading to a movement of the measuring apparatus 340 relative to the mask. By way of example, such a mechanical coupling 360 can have an influence on how strong the movements of the probe 130 and the movements of the measuring apparatus 340 are correlated with one another in response to external disturbances. It can also serve the purpose of ensuring that, in the case of an active displacement of the probe 130, the measuring apparatus 340 is displaced together therewith. By way of example, the measuring apparatus 340 and the probe 130 can be configured as a constructional unit.

The apparatus 300 has a correlation unit 390, which is embodied to correlate a measurement signal from the probe 130 and a measurement signal from the measuring apparatus 340 with one another. By way of example, the correlation unit 390 can have a phase analyzer, which is configured to establish a phase difference between the signal from the probe 130 and the signal from the measuring apparatus 340. By way of example, such a phase difference can provide information on how external disturbances propagate through the apparatus 300. By way of example, the correlation unit 390 can also compare the amplitudes of the measurement signal from the probe 130 and of the measurement signal from the measuring apparatus 340. A person skilled in the art is aware of further options for correlating the two measurement signals.

Figure 3B:
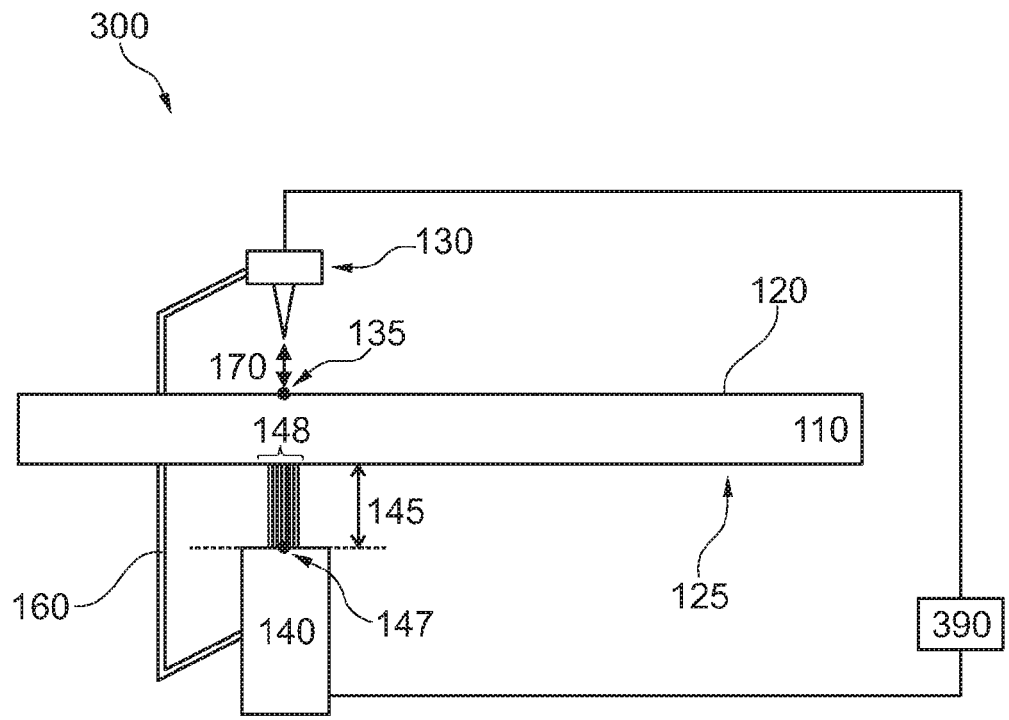

Here, the measuring apparatus 340 can also be embodied as a measuring apparatus 140 which measures a reference distance 145 of the mask 110 from a reference point 147 in a measurement region 148 of the mask 110 which is not arranged on the surface 120 of the mask 110 which is examined by the probe 130. Such an embodiment of the apparatus 300 is depicted explicitly in FIG. 3b. Here, all statements made in respect of the measuring apparatus 140 within the scope of the discussion of the embodiment 100 in FIG. 1 can also be transferred to the case shown here.

Figure 3C:
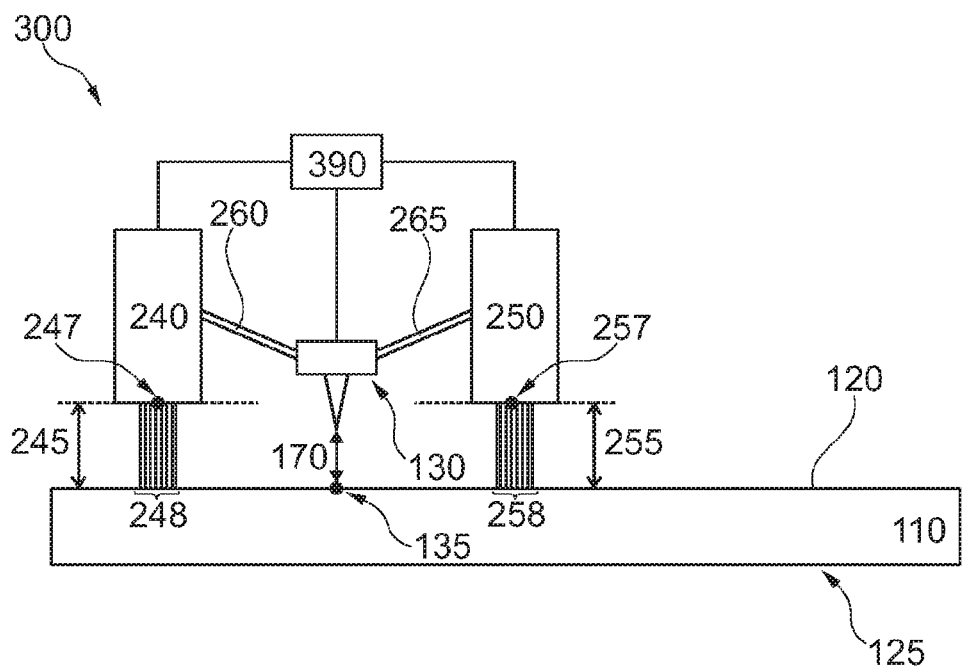

Furthermore, it is also possible that the apparatus 300 has a plurality of measuring apparatuses instead of the single measuring apparatus 340, of which plurality of measuring apparatuses some or all are coupled to the probe 130 by way of a correlation unit 390. Here, each one of the relevant measuring apparatuses can be coupled to the probe 130 by way of a dedicated correlation unit. Alternatively, some or all of the relevant measuring apparatuses are coupled to the probe 130 by way of a common correlation unit 390. FIG. 3c shows, in an exemplary manner, an embodiment of the apparatus 300 which combines the two measuring apparatuses 240 and 250, as were described in conjunction with FIG. 2a, with a common correlation unit 390. All statements made in the context of the discussion of FIGS. 2a-b can therefore also be transferred to the case shown in FIG. 3c.

Figure 4A:
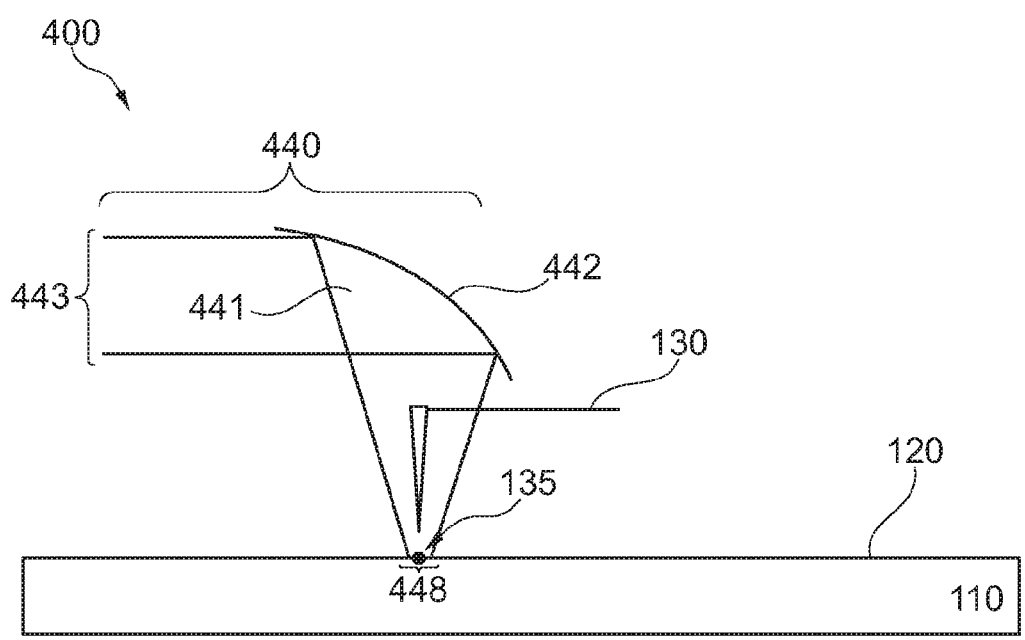
FIGS. 4a-b: show an embodiment of an apparatus according to the invention for examining a surface of a test object with a measuring apparatus, in the measurement region of which the measurement point of the probe lies.
Figure 4B:
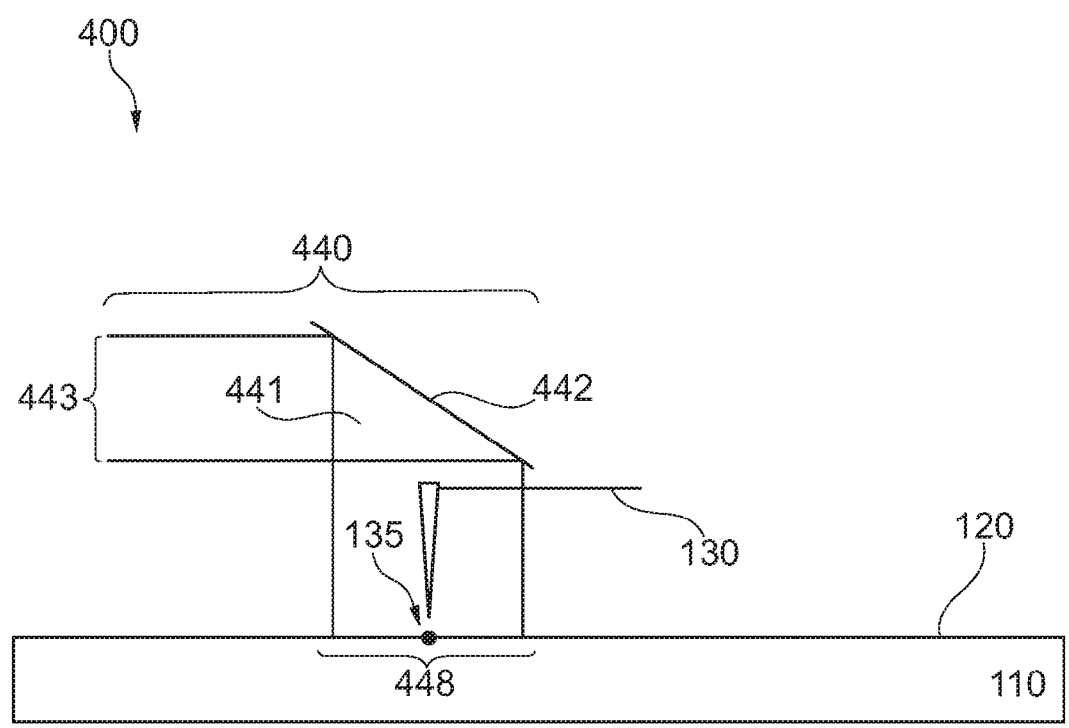

FIGS. 4a-b show embodiments of a further apparatus 400 according to the invention for examining a surface 120 of a mask 110. The apparatus 400 has a probe 130 which interacts with the surface 120 of the mask 110 at a measurement point 135. In respect of the mask 110, the surfaces 120 thereof, the probe 130 and the interaction thereof with the measurement point 135 on the surface 120 of the mask 110, reference is made to the corresponding explanations in the discussion of FIG. 1, which can be transferred directly to the embodiment 400 shown here.

The apparatus 400 has a measuring apparatus 440 for establishing a reference distance of the mask 110 from a reference point. The reference point is not explicitly plotted in FIGS. 4a-b. By way of example, it can lie on a sensor of the measuring apparatus 440 or it can be defined as a different point of the measuring apparatus 440. In respect of further details relating to the reference distance and the position of the reference point, reference is made to the corresponding explanations above.

The measuring apparatus 440 measures the reference distance of the mask in a measurement region 448 (on the surface 120) of the mask 110. Here, the measurement point 135 of the probe 130 lies within the measurement region 448. Thus, the measurement region 448 used for establishing the reference distance comprises the measurement point 135 of the probe 130, and so a disturbance compensation is always possible, at least for the "close vicinity" of the measurement point 135 of the probe 130.

In order to enable a measurement of the probe 130 within the measurement region 448 from a structural point of view, the measuring apparatus 440 shown here has a beam path 441, within which the probe 130 is arranged.

As indicated in an exemplary manner in FIGS. 4a-b for illustrative purposes, the probe 130 can be e.g. a cantilever of an atomic force microscope. Here, the beam path 441 and the extent of the measurement region 448 in which the measuring apparatus 440 measures can be selected in such a way that the light reflected by the cantilever or the "shadowing" of the cantilever in the measurement region 448 is negligible in relation to the light reflected by the mask surface 120 in the parts of the measurement region 448 that are not shadowed.

In particular, the beam path 441 of the measuring apparatus 440 can have a reflection element 442 which images an (approximately, i.e. to the extent that this is technically realizable) collimated light beam 443 onto the measurement region 448. By way of example, this can allow a compact realization of the apparatus 400 from a constructional point of view.

In FIG. 4a, the reflection element 442 is a concave or parabolic mirror. It images the collimated light beam 443 onto the measurement region 448 along a tapering light cone. Here, the diameter of the tapering light cone can still be sufficiently large in the region of the probe 130, i.e., for example, of the cantilever of an atomic force microscope, for the amount of light reflected or blocked by the probe 130 to be negligible for the purposes of the measurement of the reference distance, even though the measurement region 448 can optionally be strongly focussed, i.e. it can have a very small extent (e.g. in comparison with the diameter of the light beam 443). By way of example, the larger the aperture angle of the light cone, the less consequential the shadowing by the probe 130 may be.

By contrast, the reflection element 442 is a plane mirror in the embodiment of the apparatus 400 shown in FIG. 4b. It guides the collimated light beam 443 as still (approximately) parallel light beam onto the measurement region 448. This can minimize the influence of the shadowing by the probe 130 in a particularly good manner and further promote the (averaged) distance measurement of the reference distance.

Finally, reference is made to the fact that the measuring apparatus 440 described here can also be embodied as a first measuring apparatus 240 and/or second measuring apparatus 250 of the apparatus 200 described in FIGS. 2a-b. The measuring apparatus 440 described here can also be embodied as measuring apparatus 340 of the apparatus 300 described in FIGS. 3a-c with a correlation unit 390. The design features described in relation to the measuring apparatuses 240, 250 and 340 can therefore also be transferred to the measuring apparatus 440, and vice versa.

From the statements made above, it is clear to a person skilled in the art that the apparatuses 100, 200, 300 and 400 described herein can be combined with one another in many different ways—to the extent that these are (structurally or) technically compatible—within the scope of the invention and that the exemplary embodiments explicitly shown herein merely constitute examples which serve to promote the understanding of the invention.

In addition to the components explicitly shown in FIGS. 1, 2a-b, 3a-c and 4a-b, the apparatuses 100, 200, 300 and 400 can furthermore also still comprise further additional components.

By way of example, an apparatus 100, 200, 300, 400 according to the invention can have a disturbance source, which is configured to expose the apparatus 100, 200, 300, 400 to controllable disturbances. This can serve the examination of the influence of such external disturbances on the device 100, 200, 300, 400 under controllable conditions and therefore contribute to an improvement in the disturbance compensation.

An apparatus 100, 200, 300, 400 according to the invention can also have a placement table 180 for placing the mask 110, as shown in FIG. 2*a*. An apparatus 100, 200, 300, 400 according to the invention can moreover have an actuator 185 which is embodied to displace the placement table 180 in at least one direction, for example in the x-, y- and/or z-direction. The actuator 185 can be configured to displace the placement table 180 in such a way that a strength of the interaction 170 between the probe 130 and the surface 120 is kept substantially constant. In relation to further details in respect of the placement table 180 and the actuator 185, reference is made to the corresponding explanations elsewhere.

An apparatus 100, 200, 300, 400 according to the invention can also have one (or more) locator(s), which serve(s) to determine a position of the placement table 180 within a plane defined by the placement table. As already mentioned, the placement table can be arranged e.g. in the xy-plane such that the z-direction, which represents the measurement direction of the probe 130, is perpendicular to the plane defined by the placement table 180. By way of example, such a locator can be configured as a laser interferometer and/or as a capacitively measuring distance sensor, which is arranged next to the placement table 180 and the measurement region of which is arranged on the vertical edge of the placement table 180. Such a locator can provide additional information in respect of the response of the apparatus 100, 200, 300, 400 to external disturbances and thus improve the disturbance compensation.

As an alternative or in addition to a displaceable placement table 180, an apparatus 100, 200, 300, 400 according to the invention can have a displacement unit (not shown) which is embodied to displace the probe 130 in at least one direction, e.g. in the x-, y- or z-direction. The displacement unit can be configured to displace the probe 130 in such a way that a strength of the interaction 170 between the probe 130 and the surface 120 of the mask 110 is kept substantially constant.

In general, the same statements apply to the displacement unit as to the actuator 185 for displacing the placement table 180. Thus, the displacement unit can have e.g. one or more piezo-regulators, which are able to displace the probe 130 in one or more spatial directions.

An apparatus 100, 200, 300, 400 according to the invention can also have a probe locator (not shown) for determining a position of the probe 130 within a predefined plane. By way of example, the probe locator can supply a position of the probe 130 within a plane defined by the placement table 180 or within a plane defined by the surface 120 of the mask 110. These two planes (the plane defined by the placement table 180, the plane defined by the surface 120) can coincide, for example for a planar mask 110. Alternatively, they can be different, for example for a non-planar mask 110. It is possible e.g. to use one or more optical interferometers and/or capacitive distance measuring units as a probe locator.

Thus, the displacement of the placement table 180 and the displacement of the probe 130 constitute two possible forms of operation of an apparatus 100, 200, 300, 400 according to the invention, which can each be used on their own, or else in combination with one another.

An apparatus 100, 200, 300, 400 according to the invention can also be embodied to be calibrated by a displacement of the placement table 180 and/or a displacement of the probe 130 along a predetermined sequence of movements. Alternatively or additionally, data can also be detected in the case of an image size of zero, i.e. in the case of a stationary position of the probe 130, as is already described above.

An apparatus 100, 200, 300, 400 according to the invention can have a compensation unit for compensating external disturbances by applying a compensation signal to a signal for controlling the apparatus 100, 200, 300, 400. Thus, the disturbance compensation can be carried out at least partly in an active manner by "noise cancelling". By way of example, the signal, to which the compensation signal is applied, can serve to control the actuator 185 of the placement table 180 and/or to control the displacement unit.

Finally, the examination of a topography of the surface 120 should be mentioned as an exemplary possibility for applying an apparatus 100, 200, 300, 400 according to the invention. However, this only constitutes one option and the invention is not restricted thereto. Moreover, the invention also comprises methods for examining a surface 120 of a mask 110—or of another test object—using an apparatus 100, 200, 300, 400 according to the invention.

What is claimed is:

1. Apparatus for examining a surface of a mask, comprising:
    a. a probe which interacts with the surface of the mask; and
    b. a measuring apparatus for establishing a reference distance of the mask from a reference point, wherein
    c. the measuring apparatus measures the reference distance of the mask in a measurement region of the mask which is not arranged on the surface of the mask,
    wherein the measurement region is arranged on a side of the mask facing away from the surface.

2. The apparatus according to claim 1, wherein the measurement region and a measurement point of the probe lie substantially opposite one another on different sides of the mask.

3. The apparatus according to claim 1, wherein the reference distance of the mask from the reference point is a distance averaged over the measurement region.

4. The apparatus according to claim 1, wherein the measuring apparatus operates according to the principle of optical interference and/or according to the principle of a capacitive distance measurement.

5. The apparatus according to claim 1, wherein the reference point is a point of the measuring apparatus.

6. The apparatus according to claim 1, wherein the measuring apparatus is mechanically coupled to the probe in such a way that a movement of the probe relative to the mask leads to a movement of the measuring apparatus relative to the mask.

7. Apparatus for examining a surface of a mask, comprising:
    a. a probe which interacts with the surface of the mask;
    b. a measuring apparatus for establishing a reference distance of the mask from a reference point, in which the measuring apparatus measures the reference distance of the mask in a measurement region of the mask that is arranged on a side of the mask facing away from the surface; and
    c. a correlation unit, which is embodied to correlate a measurement signal from the probe and a measurement signal from the measuring apparatus with one another.

8. The apparatus according to claim 1, furthermore comprising a disturbance source, which is configured to expose the apparatus to controllable disturbances.

9. The apparatus according to claim 1, furthermore comprising a placement table for placing the mask and an actuator which is embodied to displace the placement table in at least one direction (x; y; z).

10. The apparatus according to claim 9, wherein the actuator is configured to displace the placement table in such a way that a strength of the interaction between the probe and the surface is kept substantially constant.

11. The apparatus according to claim 9, furthermore comprising a locator for determining a position of the placement table within a plane (xy-plane) defined by the placement table.

12. The apparatus according to claim 9, wherein the apparatus is embodied to be calibrated by a displacement of the placement table and/or a displacement of the probe along a predetermined sequence of movements.

13. The apparatus according to claim 1, furthermore comprising a displacement unit which is embodied to displace the probe in at least one direction (x; y; z).

14. The apparatus according to claim 13, wherein the displacement unit is configured to displace the probe in such a way that a strength of the interaction between the probe and the surface is kept substantially constant.

15. The apparatus according to claim 13, furthermore comprising a probe locator for determining a position of the probe within a predefined plane (xy-plane).

16. The apparatus according to claim 1, furthermore comprising a compensation unit for compensating external disturbances by applying a compensation signal to a signal for controlling the apparatus.

17. The apparatus according to claim 16 in combination with claim 9, wherein the signal serves to control the actuator and/or to control the displacement unit.

18. The apparatus according to claim 1, wherein the examination of the surface comprises an examination of a topography of the surface.

19. An apparatus for examining a surface of a mask, comprising:
   a. a probe which interacts with the surface of the mask;
   b. a first measuring apparatus for establishing a first reference distance of the mask from a first reference point, in which the first measuring apparatus measures the first reference distance of the mask in a first measurement region of the mask that is arranged on a side of the mask facing away from the surface; and
   c. a second measuring apparatus for establishing a second reference distance of the mask from a second reference point.

20. The apparatus according to claim 19, wherein a first measurement region of the first measuring apparatus and a second measurement region of the second measuring apparatus do not completely overlap.

21. The apparatus according to claim 19, wherein the first reference distance of the mask from the first reference point is a distance averaged over the first measurement region of the first measuring apparatus and/or the second reference distance of the mask from the second reference point is a distance averaged over a second measurement region of the second measuring apparatus.

22. The apparatus according to claim 19, wherein the first measuring apparatus and/or the second measuring apparatus operate according to the principle of optical interference and/or according to the principle of a capacitive distance measurement.

23. The apparatus according to claim 19, wherein the first reference point is a point of the first measuring apparatus and/or the second reference point is a point of the second measuring apparatus.

24. The apparatus according to claim 19, wherein the probe is mechanically coupled to the first measuring apparatus in such a way that a movement of the probe relative to the mask leads to a movement of the first measuring apparatus relative to the mask and/or the probe is mechanically coupled to the second measuring apparatus in such a way that a movement of the probe relative to the mask leads to a movement of the second measuring apparatus relative to the mask.

25. The apparatus according to claim 19, wherein the first measuring apparatus and/or the second measuring apparatus is embodied as a measuring apparatus according to claim 1.

26. The apparatus according to claim 7, wherein the measuring apparatus is embodied as a measuring apparatus according to claim 1.

27. The apparatus according to claim 7, wherein the correlation unit has a phase analyser, which is configured to establish a phase difference between the measurement signal from the probe and the measurement signal from the measuring apparatus.

28. The apparatus according to claim 7, wherein the measuring apparatus is embodied as a first measuring apparatus and/or as a second measuring apparatus according to claim 19.

29. Apparatus for examining a surface of a mask, comprising:
   a. a probe which interacts with the surface of the mask; and
   b. a measuring apparatus for establishing a reference distance of the mask from a reference point, wherein
   c. the measuring apparatus measures the reference distance of the mask in a measurement region of the mask, and
   d. wherein a measurement point of the probe lies within the measurement region.

30. The apparatus according to claim 29, wherein the measuring apparatus has a beam path and wherein the probe is arranged in the beam path of the measuring apparatus.

31. The apparatus according to claim 30, wherein the beam path of the measuring apparatus has a reflection element which images a collimated light beam onto the measurement region.

32. The apparatus according to claim 31, wherein the reflection element is embodied as a plane mirror or as a concave mirror.

33. The apparatus according to claim 29, wherein the measuring apparatus is embodied as a first measuring apparatus and/or as a second measuring apparatus according to claim 19.

34. The apparatus according to claim 29, wherein the measuring apparatus is embodied as a measuring apparatus according to claim 7.

35. An apparatus for examining a surface of a mask, comprising:
   a. a probe that interacts with the surface of the mask at a measurement point;
   b. a first measuring apparatus for establishing a first reference distance of the mask from a first reference point, in which the first measuring apparatus measures the first reference distance of the mask in a first measurement region of the mask; and
   c. a second measuring apparatus for establishing a second reference distance of the mask from a second reference point, in which the second measuring apparatus measures the second reference distance of the mask in a second measurement region of the mask, in which the measurement point is between the first measurement region and the second measurement region.

36. The apparatus according to claim 35, wherein the first reference distance of the mask from the first reference point is a distance averaged over the first measurement region of the first measuring apparatus and/or the second reference distance of the mask from the second reference point is a distance averaged over a second measurement region of the second measuring apparatus.

37. The apparatus according to claim 35, wherein the first measuring apparatus and/or the second measuring apparatus operate according to the principle of optical interference and/or according to the principle of a capacitance distance measurement.

38. The apparatus according to claim 35, wherein the first reference point is a point of the first measuring apparatus and/or the second reference point is a point of the second measuring apparatus.

39. The apparatus according to claim 35, wherein the probe is mechanically coupled to the first measuring apparatus in such a way that a movement of the probe relative to the mask leads to a movement of the first measuring apparatus relative to the mask and/or the probe is mechanically coupled to the second measuring apparatus in such a way that a movement of the probe relative to the mask leads to a movement of the second measuring apparatus relative to the mask.

* * * * *